United States Patent
Costa et al.

(10) Patent No.: US 9,929,125 B2
(45) Date of Patent: Mar. 27, 2018

(54) FLIP CHIP MODULE WITH ENHANCED PROPERTIES

(71) Applicant: Qorvo US, Inc., Greensboro, NC (US)

(72) Inventors: Julio C. Costa, Oak Ridge, NC (US); Thomas Scott Morris, Lewisville, NC (US); Jonathan Hale Hammond, Oak Ridge, NC (US); David Jandzinski, Summerfield, NC (US); Stephen Parker, Burlington, NC (US); Jon Chadwick, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/229,780

(22) Filed: Aug. 5, 2016

(65) Prior Publication Data

US 2016/0343592 A1 Nov. 24, 2016

Related U.S. Application Data

(63) Continuation-in-part of application No. 14/959,129, filed on Dec. 4, 2015, now Pat. No. 9,613,831.
(Continued)

(51) Int. Cl.
*H01L 23/29* (2006.01)
*H01L 23/00* (2006.01)
(Continued)

(52) U.S. Cl.
CPC .......... *H01L 24/97* (2013.01); *H01L 23/3135* (2013.01); *H01L 23/3737* (2013.01);
(Continued)

(58) Field of Classification Search
CPC ............. H01L 23/3178; H01L 23/3192; H01L 23/293; H01L 25/0655; H01L 21/563; H01L 21/565; H01L 25/50
(Continued)

(56) References Cited

U.S. PATENT DOCUMENTS

| 4,093,562 A | 6/1978 | Kishimoto |
| 4,366,202 A | 12/1982 | Borovsky |

(Continued)

FOREIGN PATENT DOCUMENTS

| CN | 103811474 A | 5/2014 |
| EP | 2996143 A1 | 3/2016 |

(Continued)

OTHER PUBLICATIONS

Applicant-Initiated Interview Summary for U.S. Appl. No. 13/852,648, dated Jan. 27, 2014, 4 pages.
(Continued)

*Primary Examiner* — Luan C Thai
(74) *Attorney, Agent, or Firm* — Withrow & Terranova, P.L.L.C.

(57) ABSTRACT

A flip chip module having at least one flip chip die is disclosed. The flip chip module includes a carrier having a top surface with a first mold compound residing on the top surface. A first mold compound is disposed on the top surface of the carrier. A first thinned flip chip die resides over a first portion of the first mold compound with interconnects extending through the first portion to the top surface wherein the first portion of the mold compound fills a region between the first flip chip die and the top surface. A second mold compound resides over the substrate and provides a first recess over the first flip chip die wherein the first recess extends to a first die surface of the first flip chip die. A third mold compound resides in the first recess and covers an exposed surface of the flip chip die.

25 Claims, 10 Drawing Sheets

Related U.S. Application Data

(60) Provisional application No. 62/202,207, filed on Aug. 7, 2015, provisional application No. 62/202,967, filed on Aug. 10, 2015, provisional application No. 62/138,177, filed on Mar. 25, 2015.

(51) Int. Cl.
*H01L 23/31* (2006.01)
*H01L 23/373* (2006.01)
*H01L 23/433* (2006.01)
H01L 25/065 (2006.01)
H01L 25/00 (2006.01)
H01L 21/56 (2006.01)
H01L 25/16 (2006.01)

(52) U.S. Cl.
CPC ........ *H01L 23/4334* (2013.01); *H01L 21/561* (2013.01); *H01L 24/05* (2013.01); *H01L 24/16* (2013.01); *H01L 24/73* (2013.01); *H01L 24/92* (2013.01); *H01L 25/0655* (2013.01); *H01L 25/16* (2013.01); *H01L 25/50* (2013.01); *H01L 2224/0401* (2013.01); *H01L 2224/05568* (2013.01); *H01L 2224/16227* (2013.01); *H01L 2224/16238* (2013.01); *H01L 2224/16258* (2013.01); *H01L 2224/32225* (2013.01); *H01L 2224/32245* (2013.01); *H01L 2224/73204* (2013.01); *H01L 2224/73253* (2013.01); *H01L 2224/92125* (2013.01); *H01L 2224/97* (2013.01); *H01L 2924/1033* (2013.01); *H01L 2924/10271* (2013.01); *H01L 2924/10329* (2013.01); *H01L 2924/1461* (2013.01); *H01L 2924/15311* (2013.01); *H01L 2924/15313* (2013.01); *H01L 2924/18161* (2013.01); *H01L 2924/19011* (2013.01); *H01L 2924/19041* (2013.01); *H01L 2924/19042* (2013.01); *H01L 2924/19043* (2013.01); *H01L 2924/19105* (2013.01)

(58) Field of Classification Search
USPC ....................................................... 257/790
See application file for complete search history.

(56) References Cited

U.S. PATENT DOCUMENTS

| | | |
|---|---|---|
| 5,061,663 A | 10/1991 | Bolt et al. |
| 5,069,626 A | 12/1991 | Patterson et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,831,369 A | 11/1998 | Furbacher et al. |
| 5,920,142 A | 7/1999 | Onishi et al. |
| 6,072,557 A | 6/2000 | Kishimoto |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,426,559 B1 | 7/2002 | Bryan et al. |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,864,156 B1 | 3/2005 | Conn |
| 6,943,429 B1 | 9/2005 | Glenn et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,109,635 B1 | 9/2006 | McClure et al. |
| 7,183,172 B2 | 2/2007 | Lee et al. |
| 7,288,435 B2 | 10/2007 | Aigner et al. |
| 7,307,003 B2 | 12/2007 | Reif et al. |
| 7,393,770 B2 | 7/2008 | Wood et al. |
| 7,427,824 B2 | 9/2008 | Iwamoto et al. |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,790,543 B2 | 9/2010 | Abadeer et al. |
| 7,855,101 B2 | 12/2010 | Furman et al. |
| 7,868,419 B1 | 1/2011 | Kerr et al. |
| 7,960,218 B2 | 6/2011 | Ma et al. |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 * | 8/2014 | Kim ...................... H01L 24/96 438/107 |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,963,321 B2 | 2/2015 | Lenniger et al. |
| 9,165,793 B1 | 10/2015 | Wang et al. |
| 9,368,429 B2 | 6/2016 | Ma et al. |
| 9,461,001 B1 | 10/2016 | Tsai et al. |
| 2001/0004131 A1 | 6/2001 | Masayuki et al. |
| 2002/0185675 A1 | 12/2002 | Furukawa |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0079686 A1 | 4/2005 | Aigner et al. |
| 2005/0212419 A1 | 9/2005 | Vazan et al. |
| 2006/0108855 A1 | 5/2006 | Gan et al. |
| 2006/0261446 A1 | 11/2006 | Wood et al. |
| 2007/0020807 A1 | 1/2007 | Geefay et al. |
| 2007/0069393 A1 | 3/2007 | Asahi |
| 2007/0075317 A1 | 4/2007 | Kato et al. |
| 2007/0121326 A1 | 5/2007 | Nall et al. |
| 2007/0190747 A1 | 8/2007 | Humpston et al. |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0164528 A1 | 7/2008 | Cohen et al. |
| 2008/0272497 A1 | 11/2008 | Lake |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0179266 A1 | 7/2009 | Abadeer et al. |
| 2009/0261460 A1 | 10/2009 | Kuan et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0173436 A1 | 7/2010 | Ouellet et al. |
| 2010/0200919 A1 | 8/2010 | Kikuchi |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2012/0003813 A1 | 1/2012 | Chuang et al. |
| 2012/0068276 A1 | 3/2012 | Lin et al. |
| 2012/0094418 A1 | 4/2012 | Grama et al. |
| 2012/0104495 A1 | 5/2012 | Zhu et al. |
| 2012/0119346 A1 * | 5/2012 | Im ...................... H01L 21/563 257/690 |
| 2012/0153393 A1 | 6/2012 | Liang et al. |
| 2012/0168863 A1 | 7/2012 | Zhu et al. |

(56) References Cited

U.S. PATENT DOCUMENTS

| | | |
|---|---|---|
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0147009 A1 | 6/2013 | Kim |
| 2013/0155681 A1 | 6/2013 | Nall |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2015/0115416 A1 | 4/2015 | Costa et al. |
| 2015/0130045 A1 | 5/2015 | Tseng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380523 A1 | 12/2015 | Hekmatshoartabari et al. |
| 2016/0002510 A1 | 1/2016 | Champagne et al. |
| 2016/0079137 A1 | 3/2016 | Leipold et al. |
| 2016/0093580 A1 | 3/2016 | Scanlan et al. |
| 2016/0155706 A1 | 6/2016 | Yoneyama et al. |

FOREIGN PATENT DOCUMENTS

| | | | |
|---|---|---|---|
| JP | 2006005025 | A | 1/2006 |
| JP | 2007227439 | A | 9/2007 |
| JP | 2008235490 | A | 10/2008 |
| JP | 2008279567 | A | 11/2008 |
| JP | 2009026880 | A | 2/2009 |
| JP | 2009530823 | A | 8/2009 |
| WO | 2007074651 | A1 | 7/2007 |

OTHER PUBLICATIONS

Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Non-Final Office Action for U.S. Appl. No. 14/715,830, dated Apr. 13, 2016, 16 pages.
Extended European Search Report for European Patent Application No. 15184861.1, dated Jan. 25, 2016, 6 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, dated Feb. 22, 2013, 58 pages.
Office Action for Japanese Patent Application No. 2011-229152, dated May 10, 2013, 7 pages.
Final Rejection for Japanese Patent Application No. 2011-229152, dated Oct. 25, 2013, 2 pages.
Final Office Action for U.S. Appl. No. 13/852,648, dated Jul. 20, 2016, 14 pages.
Notice of Allowance for U.S. Appl. No. 14/529,870, dated Jul. 15, 2016, 8 pages.
Office Action of the Intellectual Property Office for Taiwanese Patent Application No. 104130224, dated Jun. 15, 2016, 9 pages.
Author Unknown, "Fully Sintered Ferrite Powders," Powder Processing and Technology, LLC, Date Unknown, 1 page.
Author Unknown, "Hysol UF3808," Henkel Corporation, Technical Data Sheet, May 2013, 2 pages.
Final Office Action for U.S. Appl. No. 14/715,830, dated Sep. 6, 2016, 13 pages.
Non-Final Office Action for U.S. Appl. No. 14/851,652, dated Oct. 7, 2016, 10 pages.
Notice of Allowance for U.S. Appl. No. 14/959,129, dated Oct. 11, 2016, 8 pages.
International Search Report and Written Opinion for PCT/US2016/045809, dated Oct. 7, 2016, 11 pages.
Author Unknown, "96% Alumina, thick-film, as fired," MatWeb, Date Unknown, date accessed Apr. 6, 2016, 2 pages, http://www.matweb.com/search/DataSheetaspx?MatGUID=3996a734395a4870a9739076918c4297&ckck=1.
Author Unknown, "PolyOne Therma-Tech™ LC-5000C TC LCP," MatWeb, Date Unknown, date accessed Apr. 6, 2016, 2 pages, http://www.matweb.com/search/datasheeftext.aspx?matguid=89754e8bb26148d083c5ebb05a0cbff1.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Non-Final Office Action for U.S. Appl. No. 15/173,037, dated Jan. 10, 2017, 8 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,243, dated Aug. 31, 2016, 8 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.

(56) References Cited

OTHER PUBLICATIONS

Anderson, D.R., "Thermal Conductivity of Polymers," Sandia Corporation, Mar. 8, 1966, pp. 677-690.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc. 2006, 2 pages, http://www.coolpolymers.com/heatplate.asp.
Author Polymers, Unknown, "CoolPoly Thermally Conductive Plastics for Substrates and Electronic Packaging," Cool Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Heat Transfer," Cool Polymers, Inc., 2006, http://www.coolpolymers.com/heattrans.html, 2 pages.
Author Unknown, "Plastics that Conduct Heat," Plastics Technology Online, Jun. 2001, Retrieved Jun. 24, 2013, http://www.ptonline.com/articles/plastics-that-conduct-heat, 4 pages.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.

Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, YE.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, Mar. 11, 2001 (2006), 28 pages.
Parthasarathy, S., et al., "RE SOI Switch FET Design and Modeling Tradeoffs for GSM Applications," 2010 23rd International Conference on VLSI Design, (VLSID '10), Jan. 2010, pp. 194-199.
Raskin, Jean-Pierre et al., "Substrate Crosstalk Reduction Using SOI Technology," IEEE Transactions on Electron Devices, vol. 44, No. 12, Dec. 1997, pp. 2252-2261.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Rong, B., et al., "Surface-Passivated High-Resistivity Silicon Substrates for RFICs," IEEE Electron Device Letters, vol. 25, No. 4, Apr. 2004, pp. 176-178.

(56) References Cited

OTHER PUBLICATIONS

Tombak, A., et al., "High-Efficiency Cellular Power Amplifiers Based on a Modified LDMOS Process on Bulk Silicon and Silicon-on-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 15/085,185, dated Feb. 15, 2017, 10 pages.
Non-Final Office Action for U.S. Appl. No. 15/293,947, dated Apr. 7, 2017, 12 pages.
Notice of Allowance for U.S. Appl. No. 14/851,652, dated Apr. 11, 2017, 9 pages.
Final Office Action for U.S. Appl. No. 15/173,037, dated May 2, 2017, 13 pages.
Non-Final Office Action for U.S. Appl. No. 15/353,346, dated May 23, 2017, 15 pages.
Non-Final Office Action for U.S. Appl. No. 15/085,185, dated Jun. 6, 2017, 5 pages.
Notice of Allowance for U.S. Appl. No. 15/293,947, dated Aug. 14, 2017, 7 pages.
Corrected Notice of Allowance for U.S. Appl. No. 14/851,652, dated Jul. 24, 2017, 6 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/262,457, dated Aug. 7, 2017, 10 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Notice of Allowance for U.S. Appl. No. 14/885,202, dated Jul. 24, 2017, 8 pages.
Corrected Notice of Allowance for U.S. Appl. No. 14/851,652, dated Sep. 6, 2017, 5 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Notice of Allowance for U.S. Appl. No. 15/353,346, dated Sep. 25, 2017, 9 pages.
Supplemental Notice of Allowability for U.S. Appl. No. 15/287,273, dated Sep. 7, 2017, 5 pages.
Non-Final Office Action for U.S. Appl. No. 15/652,867, dated Oct. 10, 2017, 5 pages.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Bernheim et al., "Chapter 9: Lamination," Tools and Manufacturing Engineers Handbook (book), Apr. 1, 1996, Society of Manufacturing Engineers, p. 9-1.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Non-Final Office Action for U.S. Appl. No. 15/491,064, dated Jan. 2, 2018, 9 pages.
Supplemental Notice of Allowability for U.S. Appl. No. 15/287,273, dated Jan. 17, 2018, 5 pages.
Non-Final Office Action for U.S. Appl. No. 15/387,855, dated Jan. 16, 2018, 7 pages.

\* cited by examiner

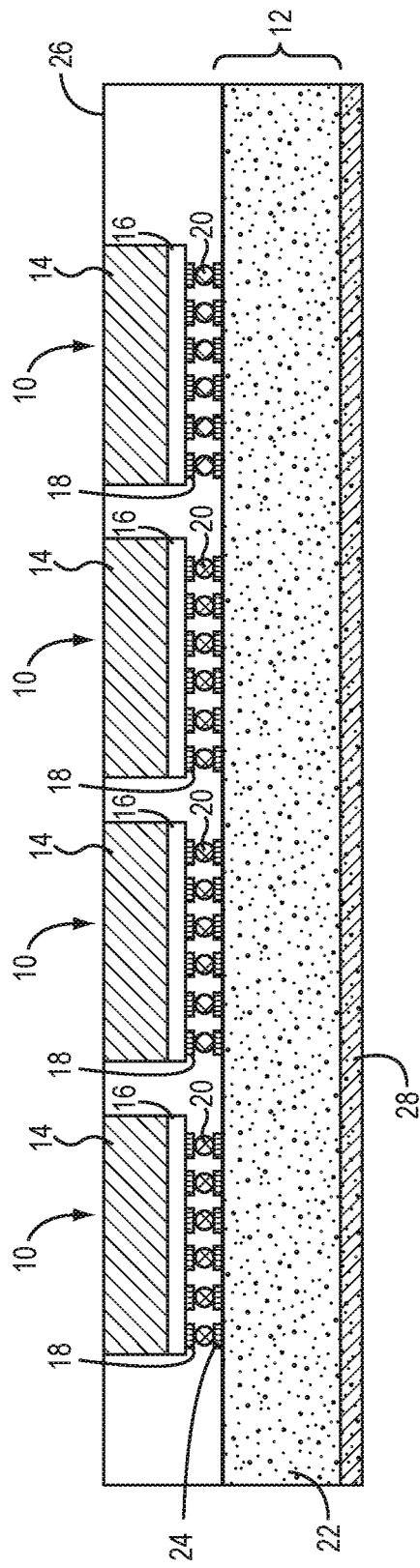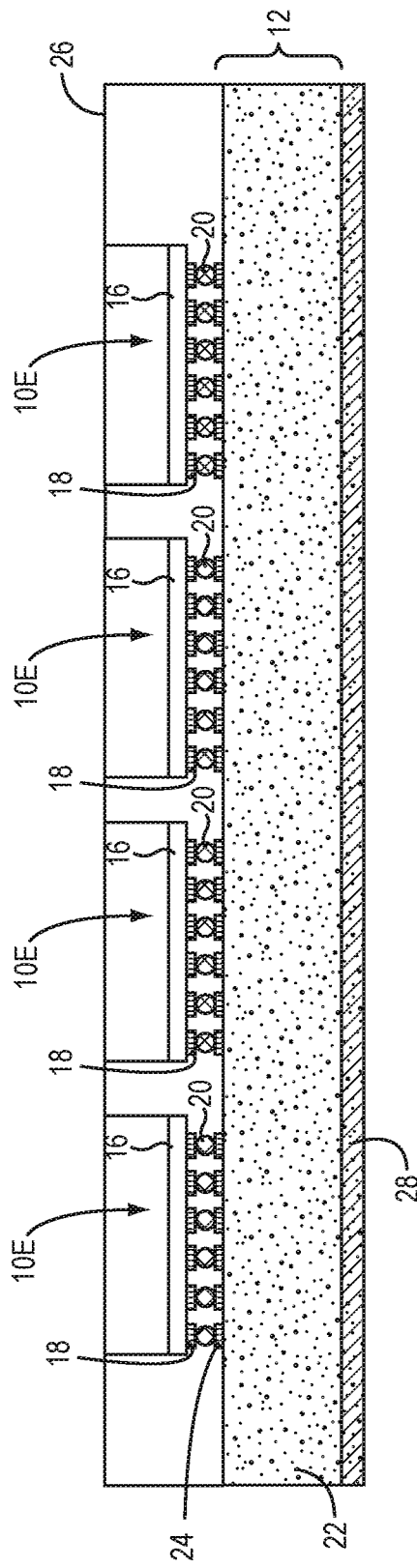

CoolPoly® D5506 THERMALLY CONDUCTIVE LIQUID CRYSTALLINE POLYMER (LCP)
CoolPoly D series of thermally conductive plastics transfers heat, a characteristic previously unavailable in injection molding grade polymers. CoolPoly is lightweight, netshape moldable and allows design freedom in applications previously restricted to metals. The D series is electrically non-conductive and can be used for its dielectric properties.

| THERMAL | SI/METRIC |
|---|---|
| THERMAL CONDUCTIVITY | 10 W/mK |
| THERMAL DIFFUSIVITY | 0.05 cm$^2$/sec |
| SPECIFIC HEAT | 1.0 J/g°C |
| COEFFICIENT OF LINEAR THERMAL EXPANSION | |
|     PARALLEL | 6.2 ppm/°C |
|     NORMAL | 5.6 ppm/°C |
| TEMPERATURE OF DEFLECTION | |
|     @ 0.45 MPa | >300 °C |
|     @ 1.80 MPa | 263 °C |
| FLAMMABILITY | V0 @ 1.0 mm |

| MECHANICAL | SI/METRIC |
|---|---|
| TENSILE MODULUS | 10900 MPa |
| TENSILE STRENGTH | 50 MPa |
| NOMINAL STRAIN @ BREAK | 0.7 % |
| FLEXURAL STRENGTH | 84 MPa |
| FLEXURAL MODULUS | 12300 MPa |
| IMPACT STRENGTH | |
|     CHARPY UNNOTCHED | 6.0 kJ/m$^2$ |
|     CHARPY NOTCHED | 3.2 kJ/m$^2$ |

| ELECTRICAL | SI/METRIC |
|---|---|
| SURFACE RESISTIVITY | 2.0E14 OHM/SQUARE |
| VOLUME RESISTIVITY | 1.6E14 OHM-CM |

| PHYSICAL | SI/METRIC |
|---|---|
| DENSITY | 1.80 g/cc |
| MOLD SHRINKAGE | |
|     FLOW | 0.1 % |
|     CROSS-FLOW | 0.3 % |

FIG. 12

FLIP CHIP MODULE WITH ENHANCED PROPERTIES

RELATED APPLICATIONS

This application claims priority to U.S. provisional patent applications No. 62/202,207, filed Aug. 7, 2016, and No. 62/202,967, filed Aug. 10, 2015.

This application is a continuation-in-part of and claims priority to U.S. patent application Ser. No. 14/959,129, filed Dec. 4, 2015, now U.S. Pat. No. 9,613,831, entitled "ENCAPSULATED DIES WITH ENHANCED THERMAL PERFORMANCE," which claims priority to U.S. provisional patent application No. 62/138,177, filed Mar. 25, 2015.

All of the applications listed above are hereby incorporated herein by reference in their entireties.

FIELD OF THE DISCLOSURE

The present disclosure relates to a packaging process, and more particularly to a packaging process to enhance thermal performance of encapsulated flip chip dies.

BACKGROUND

With the current popularity of portable communication devices and developed semiconductor fabrication technology, high speed and high performance transistors are more densely integrated on semiconductor dies. Consequently, the amount of heat generated by the semiconductor dies will increase significantly due to the large number of transistors integrated on the semiconductor dies, the large amount of power passing through the transistors, and the high operation speed of the transistors. Accordingly, it is desirable to package the semiconductor dies in a configuration for better heat dissipation.

Flip chip assembly technology is widely utilized in semiconductor packaging due to its preferable solder interconnection between flip chip dies and laminate, which eliminates the space needed for wire bonding and die surface area of a package and essentially reduces the overall size of the package. In addition, the elimination of wire connections and implementation of a shorter electrical path from the flip chip die to the laminate reduces undesired inductance and capacitance.

In flip chip assembly, mold compounds, formulated from epoxy resins containing silica particulates, are used to encapsulate and underfill flip chip dies to protect the dies against damage from the outside environment. Some of the mold compounds can be used as a barrier withstanding chemistries such as potassium hydroxide (KOH), sodium hydroxide (NaOH), and acetylcholine (ACH) without breakdown; while some of the mold compounds having good thermal conductive features can be used for heat dissipation of dies.

To accommodate the increased heat generation of high performance dies and to utilize the advantages of flip chip assembly, it is therefore an object of the present disclosure to provide a method to package flip chip dies in a configuration for better heat dissipation. In addition, there is also a need to enhance the thermal performance of encapsulated flip chip dies without increasing the package size.

SUMMARY

A flip chip module having at least one flip chip die is disclosed. The flip chip module includes a carrier having a top surface with a first mold compound residing on the top surface. A first mold compound is disposed on the top surface of the carrier. A first thinned flip chip die resides over a first portion of the first mold compound with interconnects extending through the first portion to the top surface wherein the first portion of the mold compound fills a region between the first flip chip die and the top surface. A second mold compound resides over the substrate in contact with the first mold compound and provides a first recess over the first flip chip die wherein the first recess extends to a first die surface of the first flip chip die. A third mold compound resides in the first recess and covers an exposed surface of the flip chip die.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIGS. 2 through 8 illustrate the steps associated with the etching and filling process provided in FIG. 1.

FIG. 12 is a specification table that lists thermal, mechanical, electrical, and physical specifications for an exemplary polymer material that is usable as a mold compound that is in accordance with the present disclosure.

DETAILED DESCRIPTION

Figure 1:
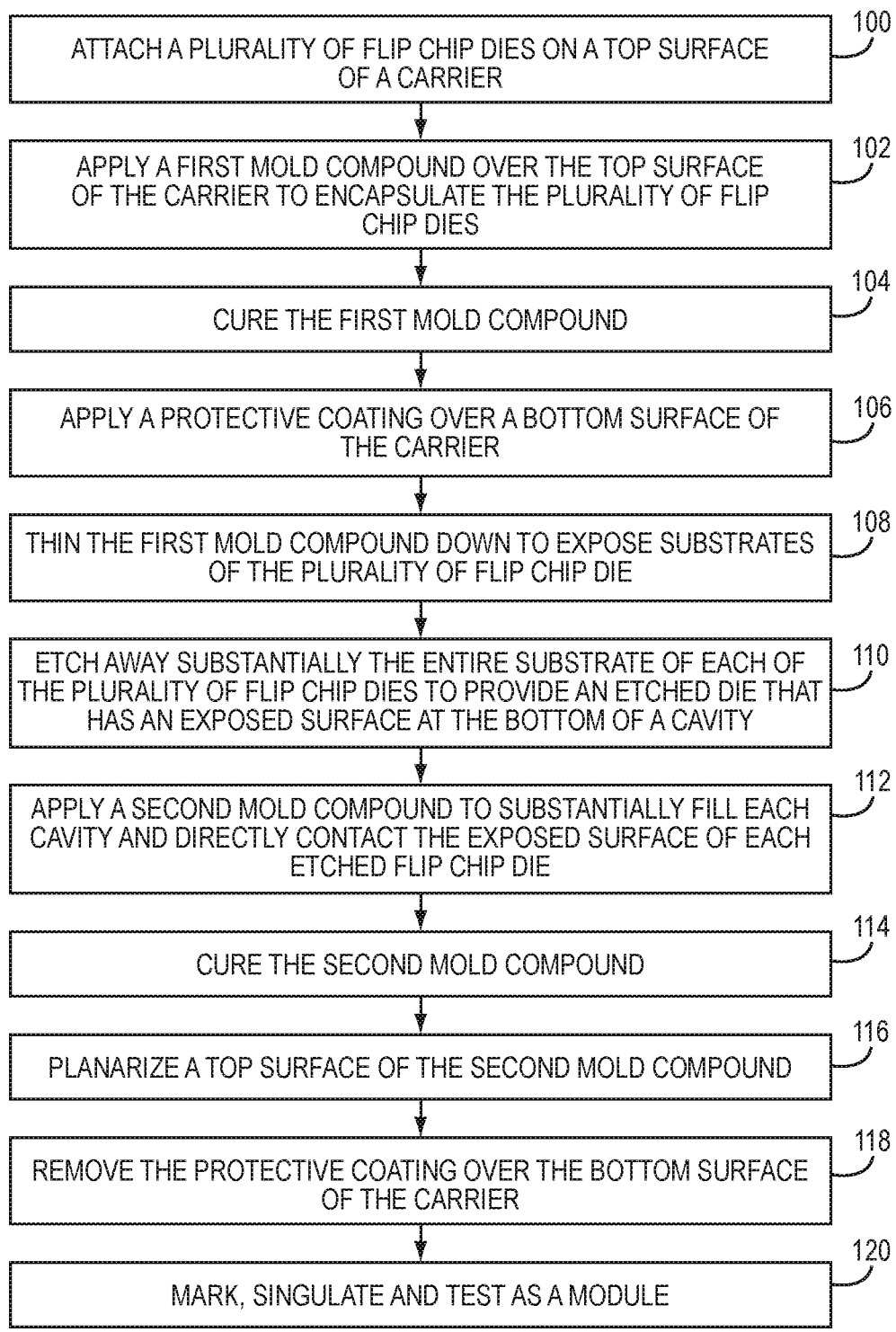
FIG. 1 provides a flow diagram that illustrates an exemplary etching and filling process according to one embodiment of the present disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Both thermoset polymers and thermoplastic polymers are disclosed as mold compounds in this disclosure. Thermoset polymers cross-link together to form an irreversible chemical bond. As such, thermoset polymers cannot be melted and re-molded after curing. A benefit of thermoset polymers is that they provide relatively high levels of dimensional stability in comparison to thermoplastic polymers. Dimensional stability is desirable for encapsulating interconnections between a flip chip die and a carrier.

In contrast, thermoplastic polymers soften when heated and become more fluid when heated past a plasticization temperature. Once cooled below the plasticization temperature, thermoplastic polymers can be reheated to be re-molded as no chemical bonding takes place like that of thermoset polymers. A benefit of thermoplastic polymers is chemical resistance. Another benefit is that additives such as carbon particles and other fillers are usable to provide thermoset polymers with various physical properties. Such fillers are readily mixed with thermoplastic polymers because there are no chemical bonds to interfere with. However, it is to be understood that thermoset polymers can also accommodate some additives and fillers with particular care being taken with regard to ratios and types of additives in comparison to thermoplastic polymers.

For the purpose of this disclosure a thinned flip chip die, also referred to as an etched flip chip die, is one with at least 95% of a semiconductor substrate removed by chemical etching, mechanical grinding, or a combination of chemical etching and mechanical grinding, or peeling. In contrast, a flip chip die with an intact semiconductor substrate is one that has not undergone a substrate removal process. However, it is to be understood that some etching of a semiconductor substrate to provide via holes and patterning can occur and the semiconductor substrate would still be considered an intact semiconductor substrate as long as 95% of an original substrate remains after etching.

Figure 2:
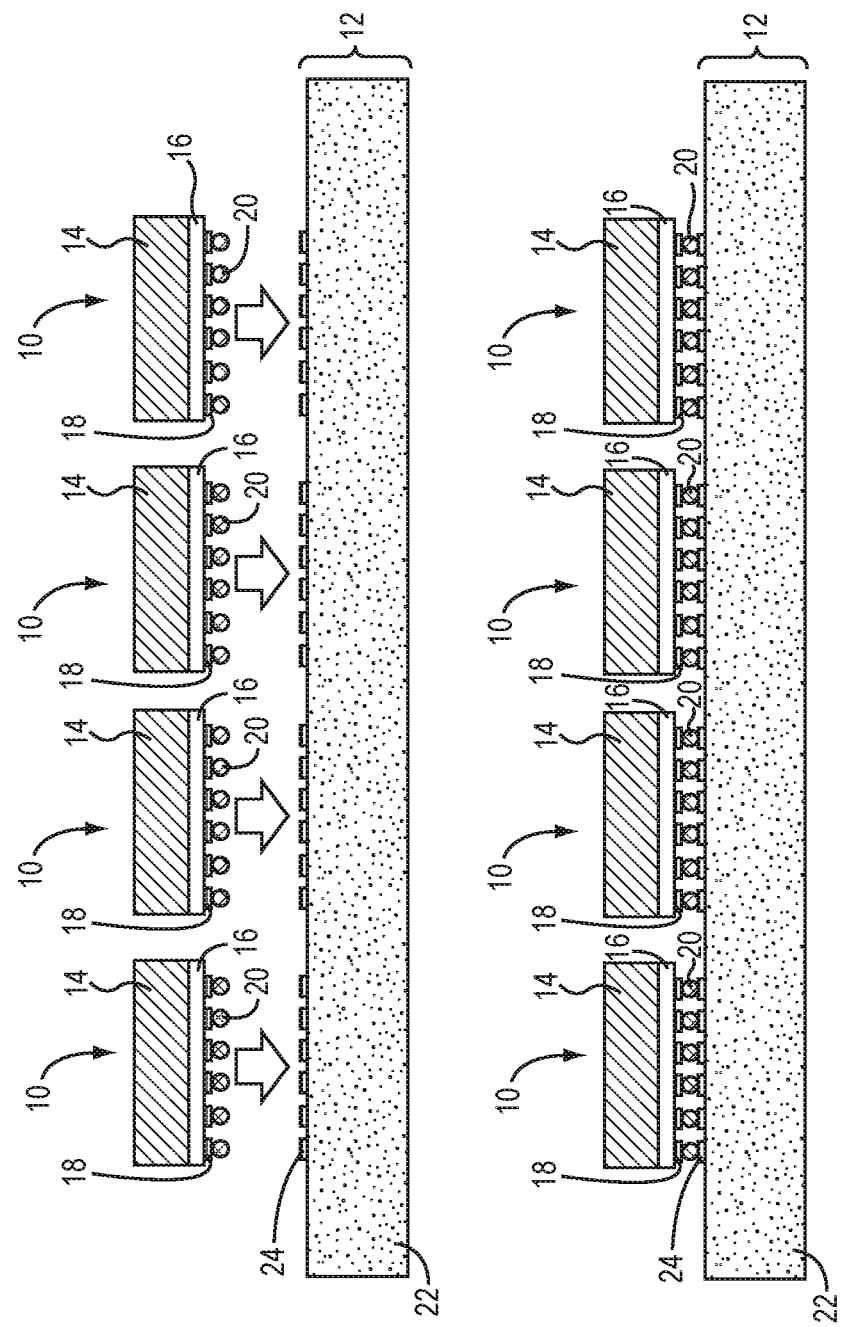

The present disclosure relates to a method to enhance the thermal performance of encapsulated flip chip dies. FIG. 1 provides a flow diagram that illustrates an exemplary etching and filling process according to one embodiment of the present disclosure. FIGS. 2-8 illustrate the steps associated with the etching and filling process provided in FIG. 1. Although various types of materials may be used for the substrate, the following examples incorporate silicon as the preferred material. Initially, a plurality of flip chip dies 10 are attached on a top surface of a carrier 12 as depicted in FIG. 2 (Step 100). The carrier of the described embodiment is formed from a laminate, but may also be formed from a wafer level fan out (WLFO) carrier, a lead frame, a ceramic carrier, or the like. For the purpose of this illustration, each flip chip die 10 includes a substrate 14 with approximately 150-500 µm thickness, a device layer 16 with approximately 4-7 µm thickness, layer contacts 18 located on a bottom surface of the device layer 16, and solder interconnections 20 provided on each of the layer contacts 18. The device layer 16 may be formed from silicon dioxide, gallium arsenide, gallium nitride, silicon germanium, and the like and includes various devices, such as diodes, transistors, mechanical switches, resonators, and the like. The carrier 12 includes a carrier body 22, carrier contacts 24 on a top surface of the carrier 12 and input/output (I/O) pads (not shown) on a bottom surface of the carrier 12. The I/O pads on the bottom surface of the carrier 12 may be formed by a ball grid array (BGA) or land grid array (LGA) method and selectively connect to the carrier contacts 24 through any number of vias (not shown). The solder interconnections 20 of the flip chip dies 10 are used to electrically and physically connect to the carrier contacts 24 of the carrier 12. As such, the backside of the substrate 14 of the plurality of flip chip dies 10 will generally be the tallest component after the attaching process. The height between the device layer 16 and the carrier body 22 often varies from 15-200 µm.

Figure 3:
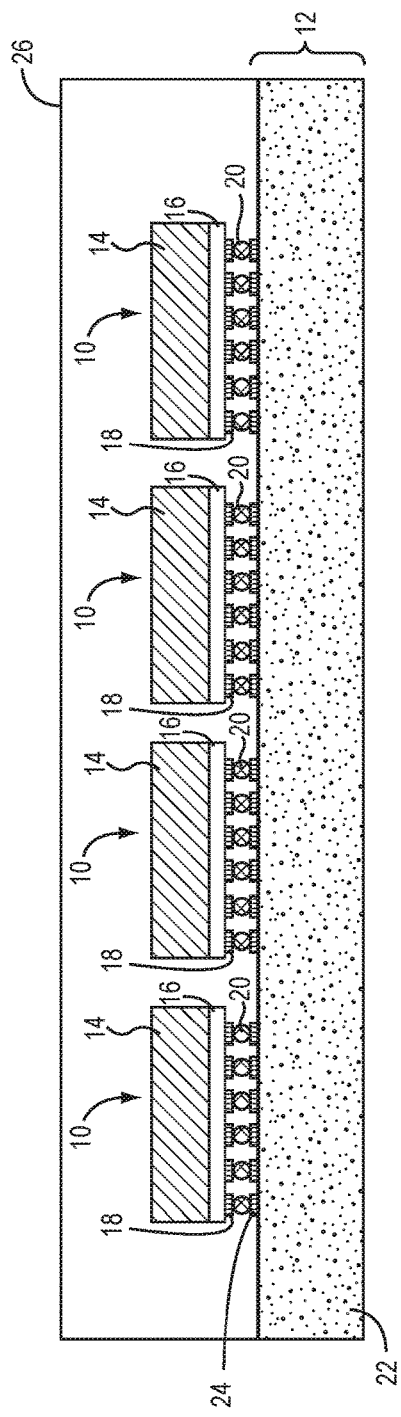

A first mold compound 26 is then applied over the top surface of the carrier 12 such that the flip chip dies 10 are encapsulated by the first mold compound 26 as illustrated in FIG. 3 (Step 102). The first mold compound 26 may be applied by various procedures, such as sheet molding, overmolding, compression molding, transfer molding, dam fill encapsulation and screen print encapsulation. The first mold compound 26 is an organic epoxy resin system or the like, such as Hitachi Chemical Electronic Materials GE-100LFC, which can be used as an etchant barrier to protect the flip chip dies 10 against etching chemistries such as KOH, NaOH and ACH. A curing process (Step 104) is then used to harden the first mold compound.

Figure 4:
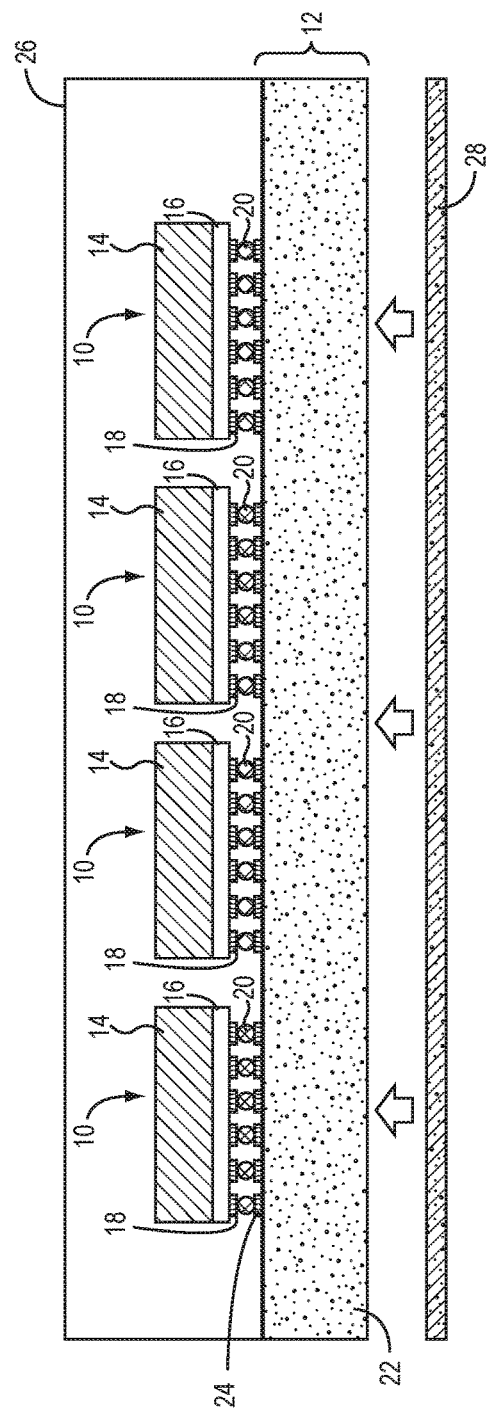

With reference to FIGS. 4 through 6, a process for etching away substantially the entire substrate 14 of each encapsulated flip chip die 10 is provided according to one embodiment of the present disclosure. The process begins by forming a protective coating 28 over the bottom surface of the carrier 12, as shown in FIG. 4 (Step 106). The purpose of the protective coating 28 is to prevent potential damage to the I/O pads (not shown) on the bottom surface of the carrier 12 in subsequent processing steps. The protective coating 28 may be a chemical resistant tape or liquid protective coating, which can withstand etching chemistries such as KOH, NaOH and ACH without breakdown. Alternatively, a rigid carrier can be sealed on the bottom surface of the carrier 12 as a protective coating 28 to prevent the I/O pads (not shown) on the bottom surface of the carrier 12 from contacting the destructive etchant materials in later etching processes.

The next process step is to thin the first mold compound 26 down to expose the back side of the flip chip dies 10, wherein the only exposed component of the flip chip dies 10 will be the substrate 14, as shown in FIG. 5 (Step 108). The thinning procedure may be done with a mechanical process. An alternative process step would be to leave the back side of the flip chip dies 10 always exposed during the molding process with the first mold compound 26.

Next, a wet/dry etchant chemistry, which may be KOH, ACH, NaOH or the like, is used to etch away substantially the entire substrate 14 of each flip chip die 10 to provide an etched flip chip die 10E that has an exposed surface at the bottom of a cavity, as shown in FIG. 6 (Step 110). Herein, etching away substantially the entire substrate 14 refers to removal of at least 95% of the entire substrate 14, and perhaps a portion of the device layer 16. As such, in some applications, there is a thin layer of the substrate 14 left at the bottom of the cavity of each etched flip chip die 10E, which covers the device layer 16, to protect the devices located on the device layer 16. For other cases, the substrate 14 is etched away completely and the device layer 16 is exposed at the bottom of the cavity of each etched flip chip die 10E.

Figure 7:
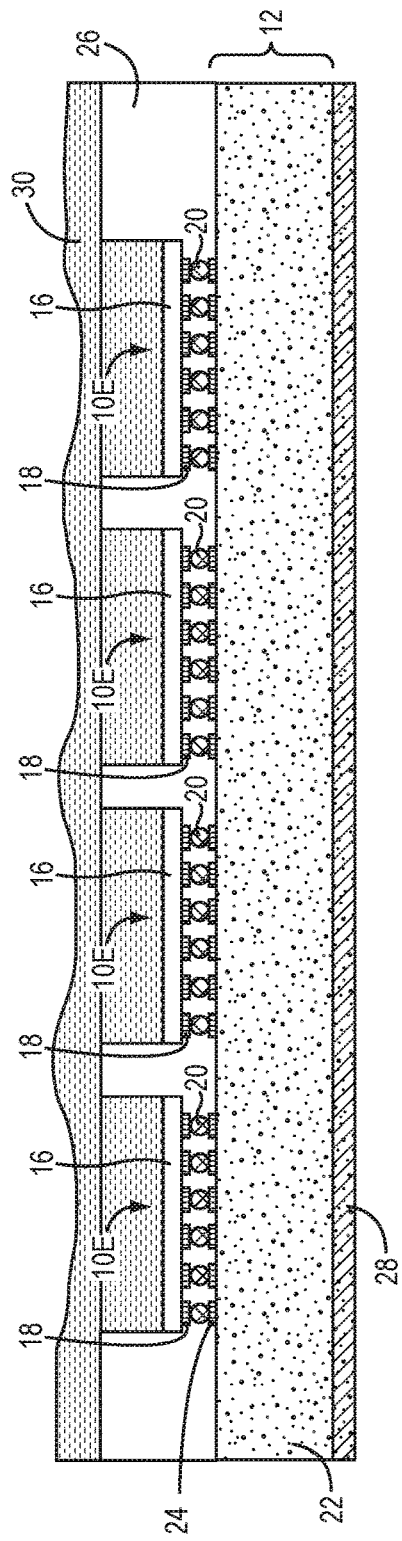
Figure 8:
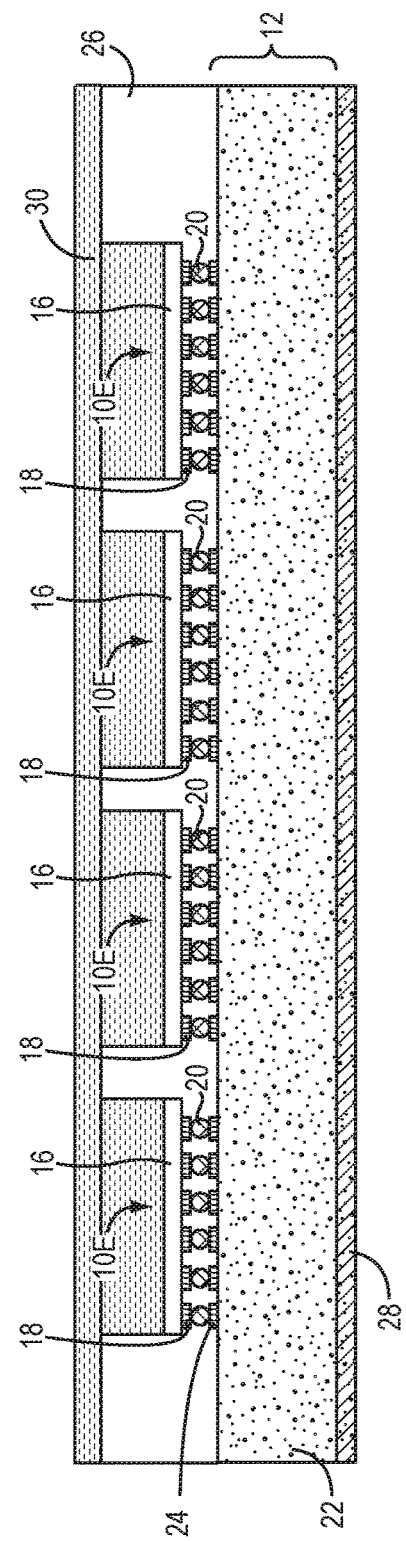

With reference to FIGS. 7 through 8, a process for filling the remaining cavity of each etched flip chip die 10E is provided according to one embodiment of the present disclosure. After the etching step is done, a second mold compound 30 is applied to substantially fill the remaining cavity of each etched flip chip die 10E, as illustrated in FIG. 7 (Step 112). The second mold compound 30 may be applied by various procedures, such as sheet molding, overmolding, compression molding, transfer molding, dam fill encapsulation, and screen print encapsulation. The second mold compound 30 is a high thermal conductivity mold compound. Compared to the normal mold compound having 1 Watts per meter Kelvin (W/m·K) thermal conductivity, a high thermal conductivity mold compound has 2.5 W/m·K~10 W/m·K or greater thermal conductivity, such as Hitachi Chemical Electronic Materials GE-506HT. The higher the thermal conductivity, the better the heat dissipation performance of the encapsulated etched flip chip dies 10E. Additionally, the second mold compound 30 directly contacts the exposed surface of each etched flip chip die 10E at the bottom of each cavity. If the substrate 14 is removed completely in the etching step (Step 110), the second mold compound 30 directly contacts the device layer 16. If there is a thin layer of substrate 14 left in the etching step (Step 110), the second mold compound 30 directly contacts the thin layer of substrate 14. Notably, the first mold compound 26 could be formed from the same material as the second mold compound 30. However, unlike the second mold compound 30, the first mold compound 26 does not have a thermal conductivity requirement in higher performing embodiments. A curing process (Step 114) is then provided to harden the second mold compound. The normal curing temperature is 175° F. and could be higher or lower depending on which material is used as the second mold compound 30.

Figure 9:
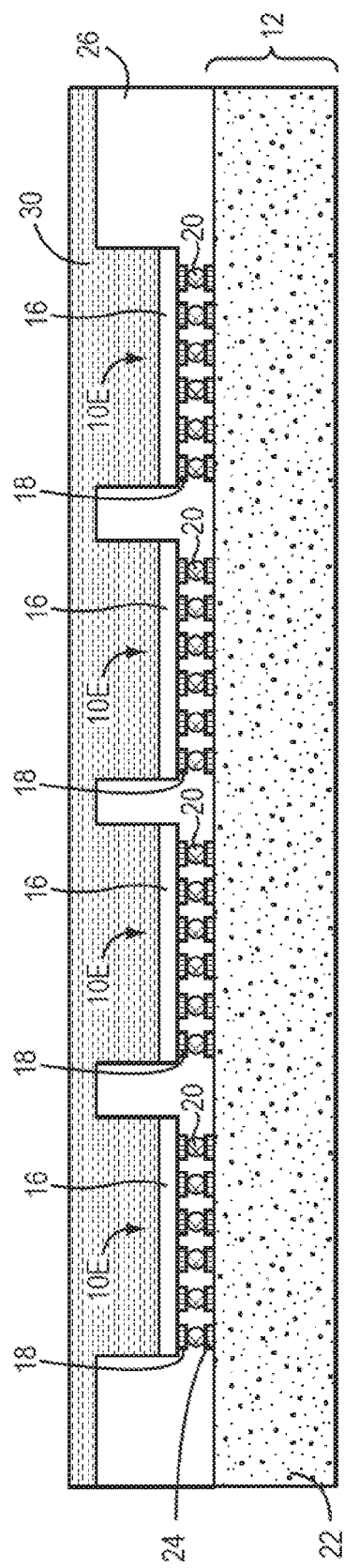
FIG. 9 illustrates an exemplary application of the present disclosure.

The top surface of the second mold compound 30 is then planarized to ensure each encapsulated etched flip chip die 10E has a flat top surface as shown in FIG. 8 (Step 116). A package grinding process may be used for planarization. Next, the protective coating 28 applied over the bottom surface of the carrier 12 is removed as illustrated in FIG. 9 (Step 118). Lastly, the product could be marked, singulated and tested as a module (Step 120).

Figure 10A:
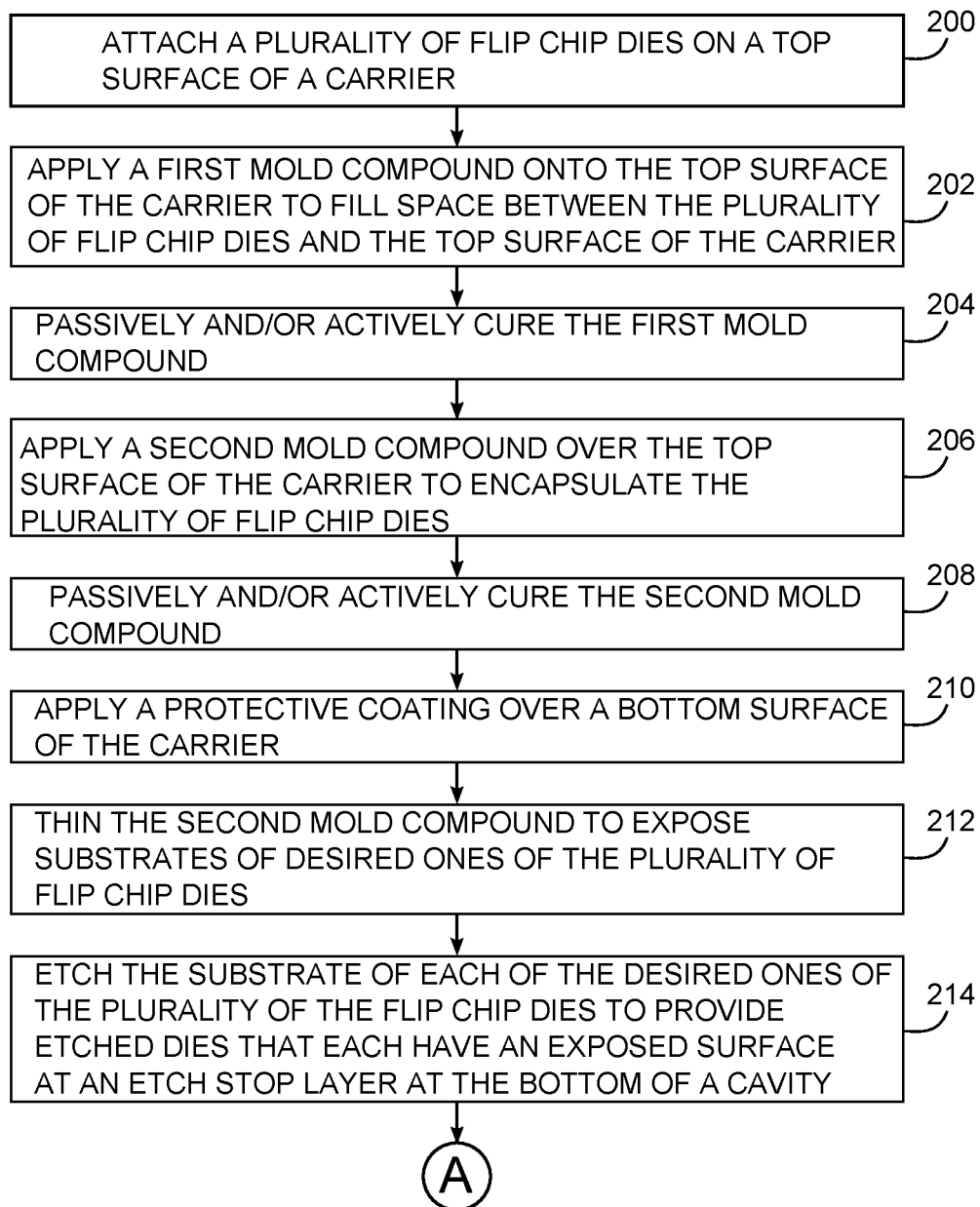
FIG. 10A is a first section of a flow diagram that illustrates additional process steps that include a first mold compound used as an underfill and a second mold compound used as an encapsulate combined with a selective etching step that removes the substrates of selected flip chip dies.
Figure 10B:
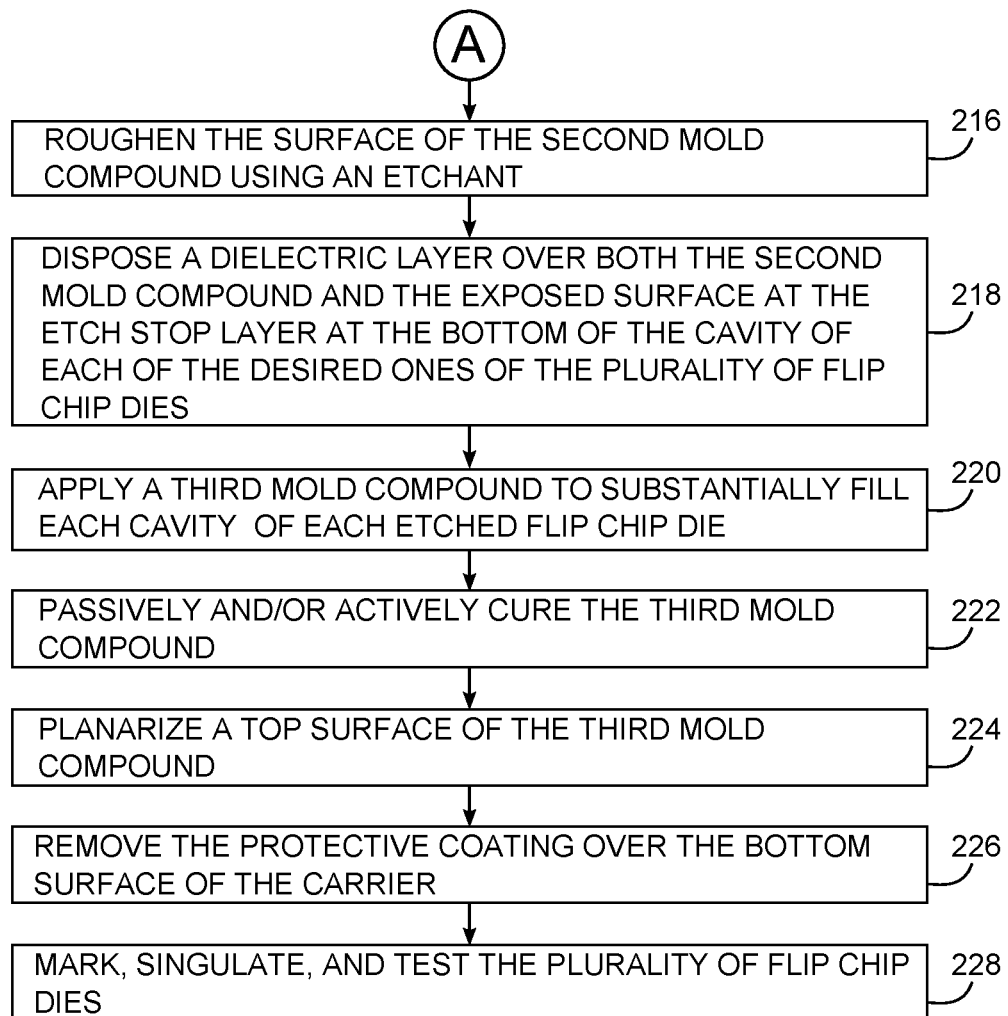
FIG. 10B is a second section for the flow diagram of FIG. 10A, which illustrates disposing a dielectric layer and applying a third mold compound to fill cavities left by etching substrates of selected flip chip dies.
Figure 11:
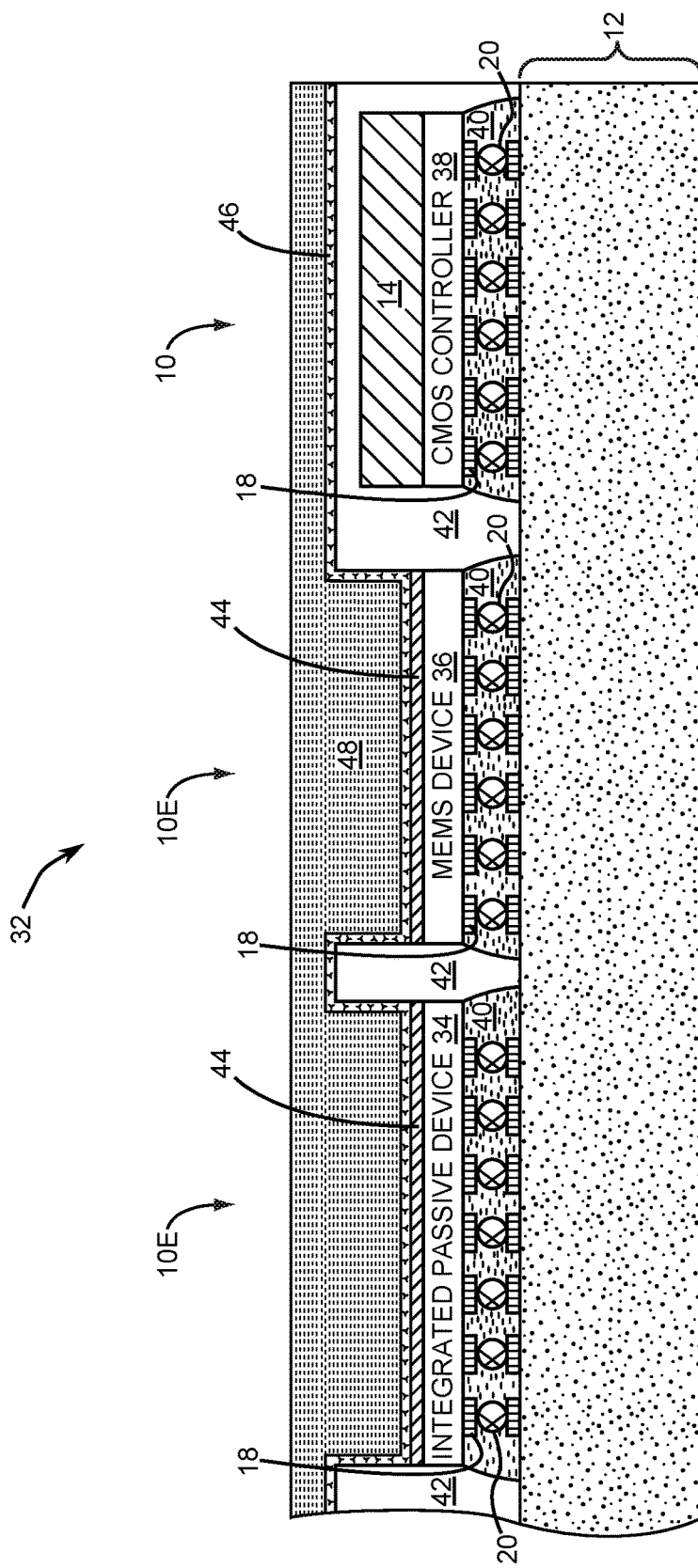
FIG. 11 is a cross-section view of a flip chip module fabricated using the process provided in FIG. 10A and FIG. 10B.

FIG. 10A and FIG. 10B make up a flow diagram that illustrates process steps for fabricating an additional embodiment of the present disclosure. FIG. 11 is a cross-section view of the additional embodiment that is a flip chip module 32, which is fabricated using the process provided in FIG. 10A and FIG. 10B. Viewing FIG. 10A in conjunction with FIG. 11, initially, a plurality of flip chip dies 10 are attached onto a top surface of the carrier 12 (Step 200). In the exemplary embodiment shown in FIG. 11, the leftmost flip chip die 10 includes an integrated passive device (IPD) 34, the middle flip chip die 10 includes a microelectromechanical systems (MEMS) device 36, and the rightmost flip chip die 10 includes a complementary metal oxide semiconductor (CMOS) controller 38. The IPD 34 typically comprises passive components such as integrated inductors, capacitors, and resistors. The MEMS device 36 is typically an RF switch that is controlled by the CMOS controller 38. The solder interconnections 20 of the flip chip dies 10 are used to electrically and physically connect to the carrier contacts 24 of the carrier 12. It is to be understood that the MEMS device 36 comprises mechanical parts that move within a cavity under a lid. For example, a MEMS RF switch version of MEMS device 36 includes a cantilever having a first end attached to an anchor and a second end situated over a conductive pad. An actuator plate beneath the cantilever is charged to attract the second end of the cantilever to make contact with the conductive pad to provide a low resistance electrical path between the anchor and the conductive pad. In other words, charging the actuator plate closes the MEMS RF switch. Discharging the actuator plate allows the second end of the cantilever to spring away from the conductive pad, thereby opening the MEMS RF switch and providing nearly infinite resistance to electrical current flow. Other types of MEMS devices such as MEMS capacitors are also envisioned as MEMS device 36. Such MEMS devices are well known to those skilled in the art, and are within the scope of this disclosure.

Next, a first mold compound 40 is applied to portions of the top surface of the carrier 12 substantially near each of the plurality of flip chip dies 10 to fill space between the plurality of flip chip dies 10 and the top surface of the carrier 12 (Step 202). The first mold compound 40 is an epoxy resin that has an uncured viscosity of no more than 360 m·Pas when measured with a cone and plate viscometer. This relatively low viscosity in comparison to encapsulating epoxy resins allows the first mold compound 40 to wick between and around the solder interconnections 20 by capillary action. As such, the first mold compound 40 is known in industry as a capillary underfill designed to cure in about eight minutes at 130° C. and about five minutes at 150° C. to minimize stress on the solder interconnections 20. In one embodiment, the first mold compound has a glass transition temperature of 113° C. with a coefficient of thermal expansion of 55 parts per million per ° C. (ppm/° C.) below the glass transition temperature of 113° C. An exemplary material for the first mold compound 40 is made by Henkel and is marketed under the product number UF3808.

In one embodiment, the first mold compound 40 includes an additive powder to increase magnetic permeability. Suitable additive powders include fully sintered nickel zinc (Ni—Zn) ferrite, magnesium zinc (Mg—Zn), and manganese (Mn—Zn) nanopowders having magnetic saturations between 45 and 80 electromagnetic units per gram (emu/g).

The first mold compound 40 is either actively or passively cured (Step 204). Actively curing the first mold compound 40 is accomplished by exposing the first mold compound 40 to energy such as heat energy, light energy, or chemical energy, depending on the material making up the first mold compound 40. Examples of adding energy to cure the first mold compound 40 include heating the first mold compound 40 to a predetermined elevated temperature such as 175° F., exposing the first mold compound 40 to ultraviolet (UV) light, or exposing the first mold compound 40 to an activating chemical vapor or spray. Passively curing the first mold compound 40 would allow the first mold compound 40 to cure over time without intervention. The first mold compound 40 can include additives that enhance thermal properties such as thermal conductivity, electrical properties such as permittivity, and/or magnetic properties such as permeability.

Once the first mold compound 40 is cured, a second mold compound 42 is applied over the top surface of the carrier 12 to encapsulate the plurality of flip chip dies 10 (Step 206). The second mold compound 42 is then passively and/or actively cured (Step 208). Actively curing the second mold compound 42 is accomplished by exposing the second mold compound 42 to energy such as heat energy, light energy, or chemical energy depending on the material making up the second mold compound 42. Passively curing the second mold compound 42 would allow the second mold compound 42 to cure over time without intervention. The second mold compound 42 can include additives that enhance thermal properties such as thermal conductivity, electrical properties such as permittivity, and/or magnetic properties such as permeability. However, it is to be understood that the second mold compound 42 does not necessarily include the same additives or the same amount of additives that may be present in the first mold compound 40. Moreover, the second mold compound 42 does not need to be the same material as the first mold compound 40. Therefore, the second mold compound 42 may or may not be cured the same way as the first mold compound 40. An exemplary material making up the second mold compound 42 is a biphenyl thermoset epoxy manufactured by Hitachi and marketed under the product number GE100-LFCS. In at least one embodiment, the second mold compound 42 and the first mold compound 40 are one in the same. For example, in at least one embodiment, the biphenyl thermoset epoxy would make up both the first mold compound 40 and the second mold compound 42.

The process continues by forming the protective coating 28 (as shown in FIGS. 4 through 8) over the bottom surface of the carrier 12 (Step 210). The purpose of the protective coating 28 is to prevent potential damage to the I/O pads (not shown) on the bottom surface of the carrier 12 in subsequent processing steps. The protective coating 28 may be a chemical resistant tape or liquid protective coating, which can withstand etching chemistries such as KOH, NaOH, and ACH without breakdown. Alternatively, a rigid carrier can be sealed on the bottom surface of the carrier 12 as a protective coating 28 to prevent the I/O pads (not shown) on the bottom surface of the carrier 12 from contacting the destructive etchant materials in later etching processes.

The next process step is to thin the first mold compound 40 down to expose the back side of select ones of the plurality of flip chip dies 10, wherein the only exposed component of the flip chip dies 10 will be the substrate 14 (Step 212). As depicted in FIG. 11, the substrate 14 of the rightmost one of the flip chip dies 10 having the CMOS controller 38, is not exposed because it is lower in height than either of the other ones of the plurality of flip chip dies 10 depicted in FIG. 11. In this exemplary embodiment, the leftmost one and the middle one of the plurality of the flip chip dies 10 are desired to have the substrate 14 removed. The thinning procedure may be done with a mechanical process. An alternative process step would be to leave the back side of the desired ones of the plurality of flip chip dies 10 always exposed during the molding process that applies the second mold compound 42.

Each of the substrates 14 exposed in the previous step are then etched to provide etched dies 10E that each have an exposed surface at an etch stop layer 44 that is disposed over each of the IPD 34 and the MEMS device 36 (Step 214). Once an etchant reaches the etch stop layer 44, the etch process inherently stops due to the chemical composition of the etch stop layer 44. The etch stop layer 44 is typically a dielectric layer such as a buried oxide (BOX) layer. The etch stop layer 44 is not needed and therefore not disposed over the CMOS controller 38.

Turning now to FIG. 10B while keeping FIG. 11 in view, the process continues by using an etchant to roughen the surface of the second mold compound 42 (Step 216). An exemplary way to achieve the roughening produced in this step is to employ a wet chemistry etchant such as potassium hydroxide and water (KOH:$H_2O$), which causes surface silica spheres that are typically present in the second mold compound 42 to dissolve leaving a pitted surface. The now pitted surface of the second mold compound 42 provides a substantial enhancement in adhesion of a subsequently applied or disposed material.

Next, a dielectric layer 46 is disposed over both the second mold compound 42 and the exposed surface at the etch stop layer 44 at the bottom of a cavity left by etching the substrate 14 of each of the etched flip chip dies 10E (Step 218). The dielectric layer 46 provides a moisture barrier that is not provided by the etch stop layer 44. An exemplary material making up etch stop layer 44 is silicon nitride SiN. The dielectric layer 46 can be between 200 Å to 5000 Å thick and is typically between 1000 Å and 2000 Å thick.

The process continues by applying a third mold compound 48 to substantially fill each cavity and directly contact the exposed surface of each of the etched ones of the plurality of flip chip dies 10 (Step 220). In this exemplary embodiment, the exposed surface is the exposed surface of the dielectric layer 46. Also, as shown in the exemplary embodiment of FIG. 11, the third mold compound 48 can be disposed over the entirety of the dielectric layer 46.

The third mold compound 48 is then passively and/or actively cured (Step 222). Actively curing the third mold compound 48 is accomplished by exposing the third mold compound 48 to energy such as heat energy, light energy, or chemical energy depending on the material making up the third mold compound 48. Passively curing the third mold compound 48 would allow the third mold compound 48 to cure over time without intervention. The third mold compound 48 can include additives that enhance thermal properties such as thermal conductivity, electrical properties such as permittivity, and/or magnetic properties such as permeability. However, it is to be understood that the third mold compound 48 does not necessarily include the same additives or the same amount of additives that may be present in either the first mold compound 40 or the second mold compound 42. Moreover, the third mold compound 48 does not need to be the same material as either the first mold compound 40 or the second mold compound 42. Therefore, the third mold compound 48 may or may not be cured the same way as either the first mold compound 40 or the second mold compound 42.

Once the third mold compound 48 is cured, a top surface of the third mold compound 48 is planarized to ensure that each encapsulated etched flip chip die 10E has a flat top surface as shown in FIG. 11 (Step 224). A package grinding process may be used for planarization. Next, the protective coating 28 applied over the bottom surface of the carrier 12 is removed as illustrated in FIG. 9 (Step 226). Lastly, the flip chip module 32 is marked, singulated and tested (Step 228).

FIG. 12 is a specification table that lists thermal, mechanical, electrical, and physical specifications for an exemplary polymer material that is usable as a mold compound that is in accordance with the present disclosure. In at least one embodiment, this exemplary polymer material is a thermoplastic that is usable as the third mold compound. Moreover, in at least one embodiment, the second mold compound and the third mold compound are one in the same and comprise this exemplary polymer material.

The exemplary polymer material specified in the specification table of FIG. 12 is made by Cool Polymers® and is sold under the label "CoolPoly® D5506 Thermally Conductive Liquid Crystalline Polymer (LCP)." It is to be understood that the specification table of FIG. 12 only provides exemplary specifications and that a variety of mechanical and physical properties are available within the scope of the present disclosure. Moreover, the quantitative values for the thermal and electrical properties provided in the table of FIG. 12 only represent exemplary values that are within the range of thermal and electrical properties already discussed in the above disclosure.

Those skilled in the art will recognize improvements and modifications to the embodiments of the present disclosure. All such improvements and modifications are considered within the scope of the concepts disclosed herein and the claims that follow.

What is claimed is:

1. A flip chip module comprising:
a carrier having a top surface;
a first mold compound residing on the top surface;
a first thinned flip chip die residing over a first portion of the first mold compound and having a first set of interconnects extending through the first portion of the first mold compound to the top surface wherein the first portion of the first mold compound fills a region between the first thinned flip chip die and the top surface;
a second mold compound residing over the carrier and in contact with the first mold compound and providing a first recess over the first thinned flip chip die wherein the first recess extends to a first die surface of the first thinned flip chip die; and
a third mold compound residing in the first recess and covering a first exposed surface of the first thinned flip chip die, wherein the first thinned flip chip die comprises a first layer with no substrate over the first layer such that the first die surface of the first thinned flip chip die in contact with the third mold compound is a top surface of the first layer.

2. The flip chip module of claim 1 further comprising a second thinned flip chip die residing over a second portion of the first mold compound and having a second set of interconnects extending through the second portion to the top surface wherein:
the second portion of the first mold compound fills a region between the second thinned flip chip die and the top surface;
the second mold compound provides a second recess over the second thinned flip chip die such that the second recess extends to a second exposed surface of the second thinned flip chip die; and
the third mold compound resides in the second recess and covers the second exposed surface of the second thinned flip chip die.

3. The flip chip module of claim 2 wherein the first thinned flip chip die provides a microelectromechanical systems (MEMS) component and the second thinned flip chip die does not provide a MEMS component.

4. The flip chip module of claim 2 wherein the first thinned flip chip die provides an integrated passive device (IPD) and the second thinned flip chip die does not provide an IPD.

5. The flip chip module of claim 1 further comprising an intact flip chip die having an intact semiconductor substrate, the intact flip chip die residing over a second portion of the first mold compound and having a second set of interconnects extending through the first portion to the top surface wherein:
the second portion of the first mold compound fills a region between the intact flip chip die and the top surface;
the second mold compound covers the intact semiconductor substrate of the intact flip chip die; and
the third mold compound covers an exposed surface of the second mold compound.

6. The flip chip module of claim 5 wherein the first thinned flip chip die is a MEMS device and the intact flip chip die is a complementary metal oxide semiconductor (CMOS) controller.

7. The flip chip module of claim 1 wherein the first mold compound, and the second mold compound, and the third mold compound are not the same with each having different physical properties.

8. The flip chip module of claim 7 wherein the first mold compound includes a ferrite nanopowder to provide magnetic permeability, the second mold compound includes a filler to provide mechanical strength, and the third mold compound includes a thermally conductive additive to provide thermal conductance through the third mold compound.

9. The flip chip module of claim 1 wherein the first mold compound and the second mold compound are both thermoset polymers with the second mold compound being harder than the first mold compound.

10. The flip chip module of claim 1 wherein the second mold compound is a thermoset polymer and the third mold compound is a thermoplastic polymer.

11. The flip chip module of claim 1 wherein the first mold compound and the second mold compound are the same.

12. The flip chip module of claim 1 wherein the second mold compound and the third mold compound are the same.

13. The flip chip module of claim 1 wherein the second mold compound has an etched surface to promote adhesion with the third mold compound.

14. The flip chip module of claim 1 wherein the first exposed surface is the surface of an etch stop layer comprising buried oxide (BOX).

15. The flip chip module of claim 1 further including a dielectric layer disposed over a top surface of the second mold compound and the first die surface of the first thinned flip chip die.

16. The flip chip module of claim 15 wherein the dielectric layer is a silicon nitride (SiN) layer.

17. The flip chip module of claim 1 wherein the third mold compound has a thermal conductivity greater than 2.5 W/m·K and an electrical resistivity greater than $10^3$ Ohm-cm.

18. A method for fabricating a flip chip module comprising:
   providing a carrier having a top surface;
   attaching a flip chip die to the top surface of the carrier by way of interconnects that extend from the flip chip die to the top surface of the carrier;
   filling space between the flip chip die and the top surface of the carrier with a first mold compound;
   applying a second mold compound onto the top surface of the carrier to encapsulate the flip chip die;
   thinning the second mold compound to expose a substrate of the flip chip die;
   etching the substrate of the flip chip die such that none of the substrate remains to provide a thinned flip chip die having an exposed surface at the bottom of a cavity; and
   applying a third mold compound to substantially fill the cavity of the thinned flip chip die.

19. The method for fabricating the flip chip module of claim 18 further including disposing a dielectric layer over the exposed surface at the bottom of the cavity before applying the third mold compound.

20. The method for fabricating the flip chip module of claim 19 wherein the exposed surface at the bottom of the cavity is a surface of an etch stop layer made of BOX and the dielectric layer is made of SiN.

21. The method for fabricating the flip chip module of claim 18 further including roughening a top surface of the second mold compound before applying the third mold compound.

22. The method for fabricating the flip chip module of claim 18 wherein the first mold compound is an epoxy resin that has an uncured viscosity of no more than 360 mPa·s when measured with a cone and plate viscometer.

23. The method for fabricating the flip chip module of claim 18 wherein the first mold compound and the second mold compound are both epoxy resins with the second mold compound being harder than the first.

24. The method for fabricating the flip chip module of claim 18 wherein the second mold compound is a thermoset polymer and the third mold compound is a thermoplastic with a thermal conductivity greater than 2.5 W/m·K and an electrical resistivity greater than $10^3$ Ohm-cm.

25. A flip chip module comprising:
   a carrier having a top surface;
   a first mold compound residing on the top surface;
   a first thinned flip chip die residing over a first portion of the first mold compound and having a first set of interconnects extending through the first portion of the first mold compound to the top surface wherein the first portion of the first mold compound fills a region between the first thinned flip chip die and the top surface;
   a second mold compound residing over the carrier and in contact with the first mold compound and extending to a first die surface of the first thinned flip chip die; and
   a third mold compound covering a first exposed surface of the first thinned flip chip die, wherein the first thinned flip chip die comprises a first layer with no substrate over the first layer, such that the first die surface of the first thinned flip chip die in contact with the third mold compound is a top surface of the first layer.

* * * * *